United States Patent
Mitani et al.

[11] Patent Number: 5,578,504
[45] Date of Patent: Nov. 26, 1996

[54] METHOD FOR DETERMINATION OF RESISTIVITY OF N-TYPE SILICON EPITAXIAL LAYER

[75] Inventors: Kiyoshi Mitani, Gunma-ken; Shigenori Saisu, Fukushima-ken, both of Japan

[73] Assignee: Shin-Etsu Handotai Co., Ltd., Tokyo, Japan

[21] Appl. No.: 275,540

[22] Filed: Jul. 15, 1994

[30] Foreign Application Priority Data

Jul. 16, 1993 [JP] Japan .................................. 5-199009

[51] Int. Cl.$^6$ .................................................. H01L 21/66
[52] U.S. Cl. .......................... 437/8; 437/238; 437/937; 148/DIG. 146
[58] Field of Search .................................. 437/6, 8, 238, 437/937; 148/DIG. 137, DIG. 146

[56] References Cited

U.S. PATENT DOCUMENTS 4,992,301  2/1991  Shishiguchi et al. ................. 437/81
5,365,877  11/1994  Kubota ................................ 437/228

FOREIGN PATENT DOCUMENTS

01181436  7/1989  Japan .
2192750   7/1990  Japan .
3259522  11/1991  Japan .
4100251   4/1992  Japan .

*Primary Examiner*—Chandra Chaudhari
*Assistant Examiner*—Michael Trinh
*Attorney, Agent, or Firm*—Ronald R. Snider

[57] ABSTRACT

A method for the determination of the resistivity of an n-type epitaxial layer formed on a silicon substrate is disclosed. This invention resides in either directly determining the true resistivity of a sample by preparing this sample without a natural oxide film which is responsible for the change with the passage of time or indirectly determining the true resistivity of a sample by intentionally forming on the sample a natural oxide film so stable to defy the change with the passage of time and measuring resistivity of this sample.

7 Claims, 10 Drawing Sheets

METHOD FOR DETERMINATION OF RESISTIVITY OF N-TYPE SILICON EPITAXIAL LAYER

BACKGROUND OF THE INVENTION

1. Field of the Invention

This invention relates to a method for the determination of the resistivity of an n-type silicon wafer. More particularly, this invention relates to a method for the determination of the true resistivity of an n-type silicon epitaxial layer by the four point probe method.

2. Description of the Prior Art

Figure 10:
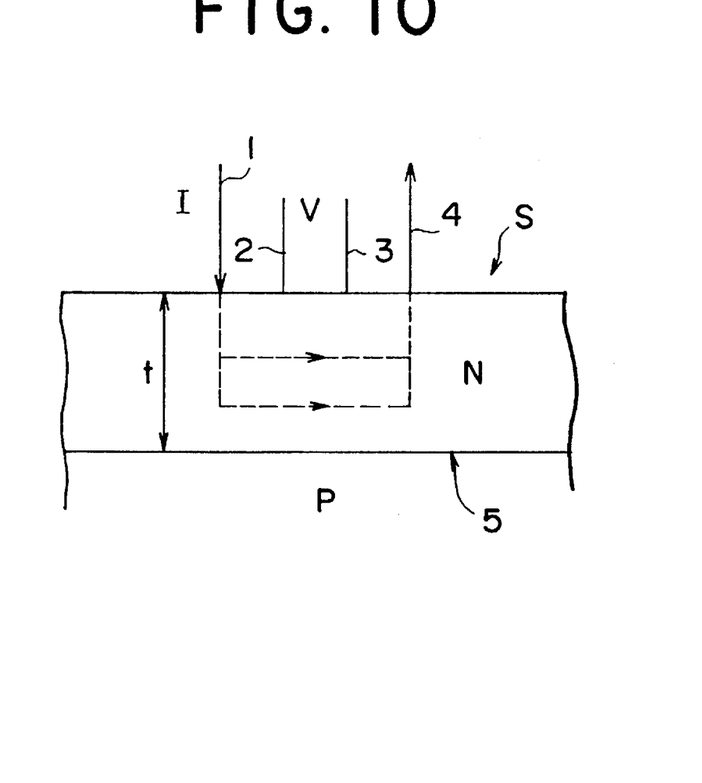
FIG. 10 is an explanatory diagram illustrating the procedure for determination of the sheet resistance by the four point probe method.

As a way of determining the resistivity of a silicon epitaxial layer grown on a silicon substrate, the four point probe method illustrated in FIG. 10 has found wide spread acceptance.

This method determines the resistivity of a sample S by arranging four point probes 1 to 4 equidistantly on the surface of the sample S, forming a flow of a direct current I from the two outer probes to the sample S, and measuring the voltage V which occurs consequently between the two inner probes. In FIG. 10, N stands for an n-type region, P for a p-type region, t for the film thickness of an epitaxial layer, and 5 for a p-n junction.

By this method of determination, the resistivity p of the epitaxial layer can be obtained in accordance with the following formula (1):

$$\rho = aRt \tag{1}$$

wherein a stands for the constant ($\pi/\ln 2$), R for the sheet resistance of the epitaxial layer, and t for the film thickness of the epitaxial layer.

In the case of the n-type epitaxial layer, the sheet resistance R is determined by obtaining growth of this n-type epitaxial layer on a p-type silicon substrate and actually measuring the sheet resistance by the four point probe method. The film thickness t of the epitaxial layer is generally determined by measuring the film thickness of an epitaxial layer which is grown on a high-concentration antimony substrate in accordance with the Fourier-Transform Infrared Spectroscopy (FTIR) method. The resistivity ρ is the product of R multiplied by t and a, a constant.

SUMMARY OF THE INVENTION

Incidentally, the resistivity ρ (sheet resistance R) is prone to the so-called time-course change, a phenomenon that this magnitude increases with the elapse of time, depending on the specification of the n-type epitaxial layer to be manufactured. The magnitude thus rising requires more than one week's time before it is stabilized. The time-course change tends to increase in accordance as the film thickness of the epitaxial layer decreases and the resistivity increases. By way of specific illustration, the results of a determination of the resistivity in accordance with the conventional method will be described below.

Wafers having epitaxial layers 10, 25, 37, and 64 μm in film thickness were severally produced by growing an n-type <111> epitaxial layer of a target resistivity of 30 Ωcm to a film thickness of 64 μm by the conventional method on the mirror polished surface of a p-type silicon wafer and then subjecting the epitaxial layer to vapor-phase etching using hydrochloric acid. By the conventional four point probe method, the epitaxial layers of these wafers were tested for resistivity.

Figure 9:
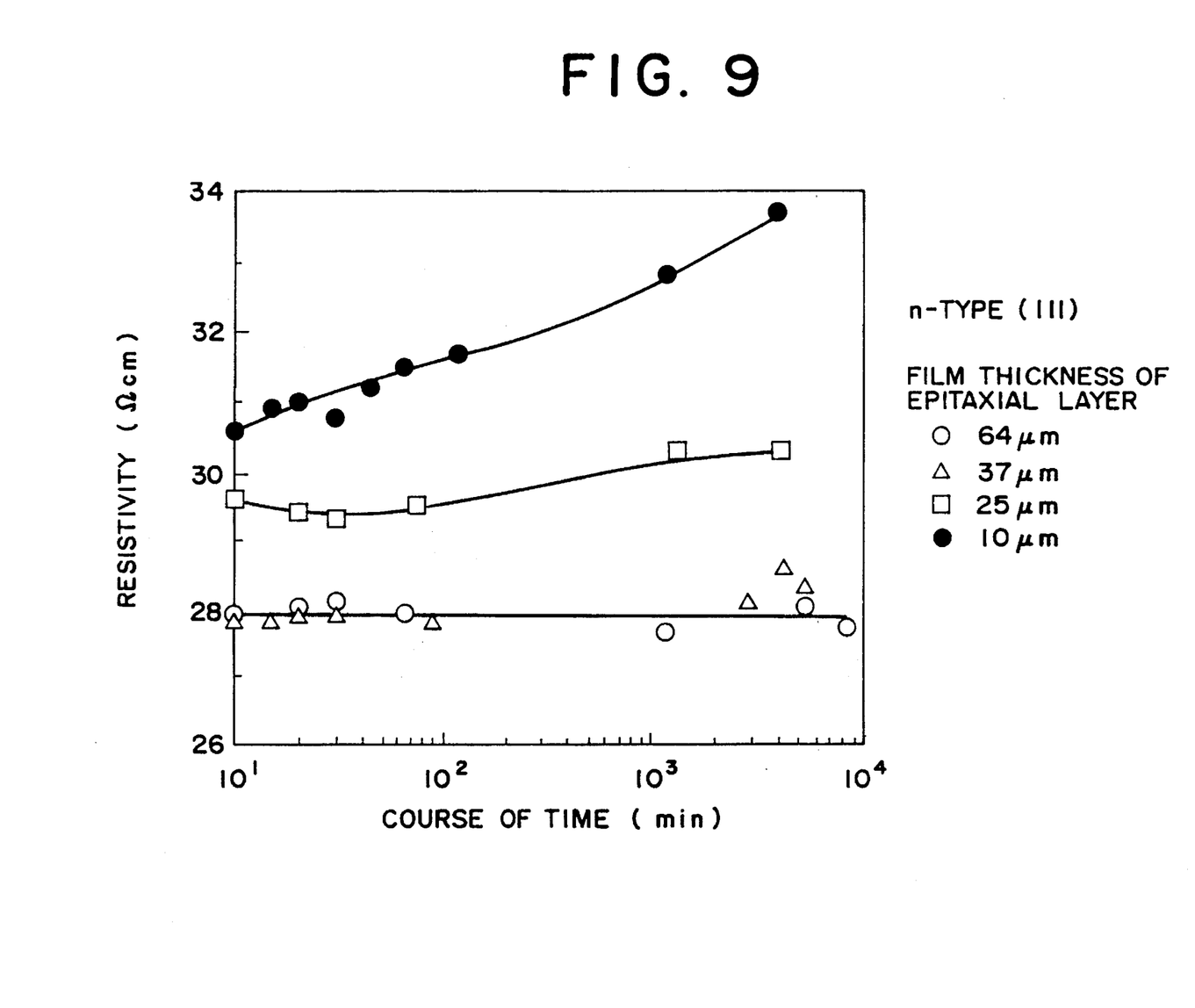
FIG. 9 is a graph showing the change in the measured magnitude of the resistivity of an n-type epitaxial layer with the passage of time in connection with the results of the conventional method.

The results of this test were as shown in FIG. 9. Since the epitaxial layers were produced in one and the same batch, they would have exhibited resistivity of one and the same magnitude. Actually, this was not the case. Specifically, it is clearly noted from the test results that when the epitaxial growth is attained by the conventional method, the initial resistivity increases and the ratio of change thereof also increases in accordance as the film thickness of the epitaxial layer decreases because the surface of the epitaxial layer produces a natural oxide film.

On account of this change with the passage of time, it is doubtful whether the actually measured resistivity represents a true magnitude or not. Thus, it is not improbable that the produced epitaxial layer will be rejected for apparently inferior quality. This phenomenon of aging also entails the disadvantage that the apparent inferiority of quality raises the problem of guaranty and exerts an adverse effect on the setting of production conditions.

Further, an effort to determine the true resistivity of an epitaxial layer which is inherently prone to the change with the passage of time entrains the disadvantage that this determination must be performed immediately after the epitaxial growth.

The present invention, produced in view of the true state of the prior art described above, has for an object thereof the provision of a method which enables the determination of the true resistivity of an n-type silicon epitaxial layer to be easily and conveniently attained by the four point probe method by virtue of a prescribed pretreatment to be given to a sample under test.

Now, the discussion which the present inventors have devoted to the change of the resistivity of an n-type silicon epitaxial layer with the passage of time will be described in detail below with reference to FIG. 11.

The method for determining the resistivity of the epitaxial layer through the four point probe method, as implied by the aforementioned formula (1), consists in finding the product of the sheet resistance R of the epitaxial layer measured by the four point probe method multiplied by the film thickness t of the epitaxial layer obtained by the FTIR and the constant a.

The fact that the four point probe method unveils the occurrence of a change with the passage of time actually represents the increase of Δρ in resistivity due to the increase of ΔR in sheet resistance measured by the four point probe method. To be specific, the actually measured resistivity, ρ+Δρ, can be obtained in accordance with the following formula (2).

$$\rho + \Delta\rho = a(R + \Delta R)t \tag{2}$$

The film thickness t of the epitaxial layer which appears in the formula (2) is believed to be constant because the silicon substrate sample has not been heated after the process of epitaxial growth and, therefore, has not undergone any change from the metallurgical point of view.

Incidentally, the true resistivity ρ which is fixed by the physical amount of a dope is constant because it does not undergo any change with the passage of time. It is, therefore, logical to conclude from the electrical point of view that the film thickness of the epitaxial layer is decreased by Δt in accordance with the increment ΔR in the formula (2) so as to ensure the constancy of ρ. Thus, the resistivity ρ can be found in accordance with the following formula (3).

$$\rho = a(R+\Delta R)(t-\Delta t) \qquad (3)$$

Figure 11:
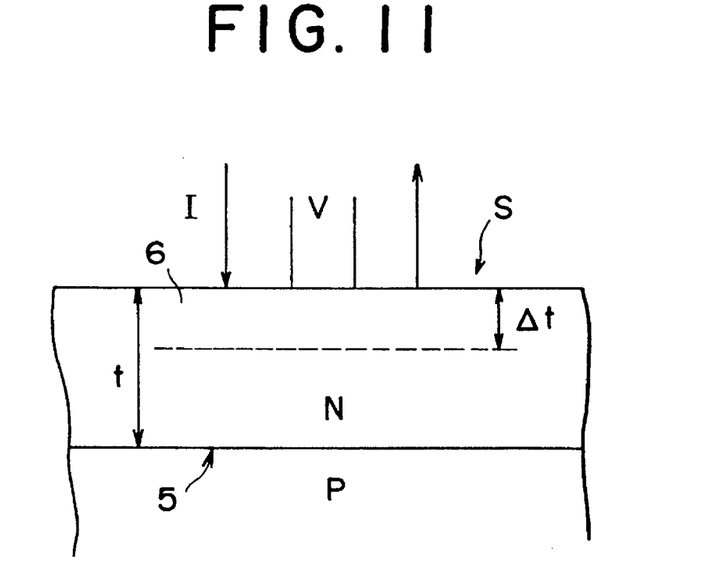
FIG. 11 is an explanatory diagram illustrating a depletion layer formed on the surface of an n-type epitaxial layer.

This decrement Δt is logically considered to have been induced not metallurgically but electrically and is specifically believed to be ascribable to the formation on the surface of a silicon substrate (silicon wafer) of a depletion layer 6 which is impervious to electric current as illustrated in FIG. 11 (the decrement Δt representing the expansion of the depletion layer).

The change of the resistivity with the passage of time is not observed in the p-type silicon but is observed exclusively in the n-type silicon. From this fact, it is inferred that the depletion layer 6 is formed because the natural oxide formed on the surface of silicon develops a negative electric charge. In fact, there have been obtained test results which endorse this inference.

From the formula (1), the formula (2), and the formula (3), the following formulas can be derived.

$$\Delta\rho = a(R+\Delta R)\Delta t = a\Delta Rt$$

Hence, $\Delta t = [\Delta R/(R+\Delta R)]t$

Further, the amount of negative charge Ns (/cm$^2$) in the natural oxide film which induces the increment Δt satisfies the following expression, depending on the condition of charge neutrality.

$$Ns = \Delta t \cdot Np$$

(Np: Dopant concentration in epitaxial layer)

From the discussion described above, it is concluded that the resistivity of the n-type silicon is changed with the passage of time because the negative charge which exists in the natural oxide film formed on the surface of an epitaxial layer increases with the elapse of time and, in consequence thereof, a depletion layer is formed on the surface of the epitaxial layer and the film thickness of the electrically effective epitaxial layer is decreased by Δt.

The present invention is based on this discussion. The essence of this invention resides in either directly determining the true resistivity of a sample by preparing this sample without a natural oxide film which is responsible for the change with the passage of time or indirectly determining the true resistivity of a sample by intentionally forming on the sample a natural oxide film so stable to defy the change with the passage of time and measuring resistivity of this sample.

The first aspect of this invention is the method for determination of the resistivity of an n-type epitaxial layer formed on a silicon substrate, which is characterized by subjecting the surface of the n-type epitaxial layer to hydrogen termination and then measuring sheet resistance of the surface of the n-type epitaxial layer kept in the hydrogen terminated state by means of the four point probe method.

The second aspect of this invention is the method for determination of the resistivity of an n-type silicon epitaxial layer, which is characterized by the steps of growing the n-type epitaxial layer on a silicon substrate, displacing the inner gas of an epitaxial growth reactor with hydrogen gas and cooling the silicon substrate to a temperature below 400° C. thereby effecting the hydrogen termination of the surface of the n-type epitaxial layer, subsequently displacing the hydrogen gas in the epitaxial growth reactor with an inert gas and simultaneously cooling the silicon substrate to normal room temperature, removing the cooled silicon substrate from the epitaxial growth reactor, and measuring sheet resistance of the n-type epitaxial layer by the four point probe method.

The third aspect of this invention is the method for determination of the resistivity of an n-type silicon epitaxial layer grown on a silicon substrate, which is characterized in that the silicon substrate is caused to contact with a dilute aqueous hydrofluoric acid solution to remove the natural oxide film on the surface of the n-type epitaxial layer and, at the same time, effect the hydrogen termination, rinsed with deionized (DI) water, dried, and subjected to measurement of the sheet resistance by the four point probe method.

The fourth aspect of this invention is the method for determination of the resistivity of an n-type silicon epitaxial layer, which is characterized in that the product of the sheet resistance measured by the four point probe method multiplied by the film thickness of the n-type epitaxial layer determined by the FTIR method or the spreading resistance (SR) method and the constant (π/1n2) is obtained as the resistivity.

The fifth aspect of this invention is the method for determination of the resistivity of an n-type silicon epitaxial layer grown on a silicon substrate, which is characterized by the steps of preparatorily finding changes of resistivity with the passage of time with respect to n-type epitaxial layers possessing varying magnitudes of resistivity, treating the surface of an n-type epitaxial layer on a silicon substrate subjected to determination of resistivity with a chemical solution thereby forming a stable oxide film on the surface, rinsing the treated surface of the n-type epitaxial layer, drying the wet n-type epitaxial layer, measuring the sheet resistance by the four point probe method thereby obtaining the resistivity after a change with the passage of time, and obtaining true resistivity on the basis of the magnitude of resistance in combination with the ratio of change in the resistivity.

The sixth aspect of this invention is the method for determination of the resistivity of an n-type silicon epitaxial layer, which is characterized in that a mixed solution consisting of ammonia, hydrogen peroxide, and water, a mixed solution consisting of hydrochloric acid, hydrogen peroxide, and water, an aqueous hydrogen peroxide solution, or DI water is used as the chemical solution for the treatment mentioned above.

The seventh aspect of this invention is the method for determination of the resistivity of an n-type silicon epitaxial layer, which is characterized in that the product of the sheet resistance measured by the four point probe method multiplied by the film thickness of the n-type epitaxial layer determined by the FTIR method or the SR method and the constant (π/1n2) is obtained as the resistivity after completion of the change with the passage of time.

BRIEF DESCRIPTION OF THE DRAWINGS

The invention will be better understood and the objects and features thereof other than those set forth above will become apparent when consideration is given to the following detailed description thereof, which makes reference to the annexed drawings wherein.

DETAILED DESCRIPTION OF THE PREFERRED EMBODIMENTS

The method for determination of the resistivity according to the first aspect of this invention allows the true resistivity of an n-type epitaxial layer to be determined accurately because the surface of the n-type epitaxial layer is maintained in the state of hydrogen termination during the measurement of the sheet resistance.

The method for determination of the resistivity according to the second aspect of this invention, owing to the treatment for hydrogen termination, imparts to the surface of the silicon substrate such a state of hydrogen termination that formation of a natural oxide film on the surface proceeds very gradually and the state of hydrogen termination itself lasts stably for a long time even when the silicon substrate is stored under normal temperature and humidity conditions. By this reason, the silicon substrate which has been removed from the epitaxial growth reactor does not always need to be stored under the condition of low humidity but must only be subjected without delay to the measurement of sheet resistance under the normal temperature and humidity conditions to ensure accurate determination of the true resistivity.

The surface of the silicon substrate which has been treated for hydrogen termination by the method for determination of the resistivity according to the third aspect of this invention suffers the formation of a natural oxide film to proceed slightly faster than the surface treated likewise for hydrogen termination by the method according to the second aspect of this invention.

The method of the third aspect of this invention nevertheless permits the true resistivity to be accurately determined by causing the sample in an atmosphere of prescribed temperature and humidity thereby enabling the surface of the n-type epitaxial layer to be maintained in the state of hydrogen termination. Even in the absence of the storage under the specific condition mentioned above, the accurate determination of the true resistivity can be attained infallibly because the determination is carried out before the formation of a natural oxide film takes place.

The method for determination of the resistivity according to the fifth aspect of this invention allows the true resistivity to be obtained easily by calculating the product of the freshly determined resistivity after completion of the change due to the passage of time multiplied by the predetermined ratio of change in resistivity.

The method for determination of the resistivity according to the sixth aspect of this invention allows a stable oxide film to be formed on the surface of an n-type epitaxial layer easily and conveniently by the treatment using a mixed solution consisting of ammonia, hydrogen peroxide, and water, a mixed solution consisting of hydrochloric acid, hydrogen peroxide, and water, aqueous hydrogen peroxide solution, or DI water. The presence of the oxide film mentioned above lends itself to the prevention of the resistivity from being changed with the passage of time. Further, the magnitude of the resistivity of a wafer coated with the aforementioned oxide film coincides with the magnitude of convergence of the change with the passage of time.

Now, the present invention will be described in detail below with reference to working examples and comparative experiments. The working examples of this invention will be explained in comparison with the comparative experiments below.

EXAMPLE 1

A plurality of silicon wafers severally having n-type <111> epitaxial layers of target resistivity of 30 Ωcm grown to a film thickness of 15 μm were used as samples. These samples were left standing for a fixed length of time in atmospheres having a substantially constant temperature (normal room temperature) and varying degrees of humidity (50%, 60%, and 95% of relative humidity) and then tested for sheet resistance by the conventional procedure using a four point probe measuring apparatus. The film thickness of the epitaxial layer was determined by the SR (Test Run 1).

Separately, a plurality of silicon wafers severally having magnitudes of resistivity converted to a prescribed value (due to completion of the change with the passage of time) were prepared, immersed for one minute in a dilute aqueous solution containing hydrofluoric acid at a concentration of not more than 5% by weight (aqueous HF solution), rinsed with DI water, dried at normal room temperature, then left standing for a fixed length of time in an atmosphere having a substantially constant temperature (normal room temperature) and varying degrees of humidity (50%, 60%, and 95% of relative humidity), and tested for resistivity by the same procedure as described above to examine the condition of change in resistivity due to the length of time of standing. The resistivity was determined also by the C-V method (Shottky method) (Test Run 2).

EXAMPLE 2

In an epitaxial growth reactor adapted to utilize a vapor-phase reaction, p-type silicon wafers were set in place, n-type <111> epitaxial layer having a target resistivity of 30 Ωcm were grown to a film thickness of 15 μm at the temperature normally used for the epitaxial growth of this kind, and then the inner temperature of the reactor was cooled to about 200° C. with the interior of the reactor continuously swept with hydrogen. Subsequently, the interior of the reactor was displaced with nitrogen, the reactor was cooled to normal room temperature, and the silicon wafers were removed from the reactor and immediately tested for sheet resistance. The silicon wafers were then left standing for a fixed length of time in an atmosphere having a substantially fixed temperature (normal room temperature) and different degrees of humidity (50%, 60%, and 95% of relative humidity) and then tested for sheet resistance.

EXAMPLE 3

Silicon wafers produced by the conventional method and left to change resistivity with the passage of time and converge to a substantially constant value were subjected to the HF treatment for hydrogen termination in the same manner as in Example 1, then severally immersed in (1) a mixed solution consisting of ammonia, hydrogen peroxide, and water, (2) a mixed solution consisting of hydrochloric acid, hydrogen peroxide, and water, (3) aqueous hydrogen peroxide solution, and (4) purified water for forced formation of a natural oxide film, rinsed with DI water [in the test runs using (1) through (3)] and dried at normal room temperature, and tested for sheet resistance of epitaxial layer by the procedure of Example 1 and for film thickness of epitaxial layer by the SR method.

EXAMPLE 4

Silicon wafers having n-type <111> epitaxial layers of target magnitudes of resistivity of about 1.5, about 3.5, about 10, and about 25 Ωcm grown by the conventional method on the mirror polished surfaces of p-type silicon wafers were prepared as samples. The samples were tested for sheet resistance and for film thickness of epitaxial layer.

To be specific, the samples were tested for sheet resistance by the four point probe method either immediately after the epitaxial growth or immediately after the HF treatment performed subsequently to the epitaxial growth. These samples were treated in the same manner as in Example 3 to have a natural oxide film formed on the surface of epitaxial layer and then tested for sheet resistance of epitaxial layer by the same procedure as used in Example 1 and for film thickness of epitaxial layer by the SR method.

The magnitudes of resistivity of the samples before the start of change with the passage of time and the magnitudes of resistivity thereof after the completion of the change were found on the basis of the magnitudes of sheet resistance of the samples before the start of the change (true resistivity), the magnitudes of sheet resistance after the completion of the change (after treatment with a mixed solution consisting of ammonia, hydrogen peroxide, and water), and the numerical values of the film thickness of epitaxial layer. Then, in accordance with the following formula (4), the expansions $\Delta t$ of the depletion layer were calculated.

$$\rho = [(t-\Delta t)/t] \cdot (\rho NH_4OH) \qquad (4)$$

wherein $\rho$ stands for the resistivity of an epitaxial layer before the start of the change with the passage of time, $\Delta t$ for the expansion of a depletion layer, and $\rho NH_4OH$ for the resistivity of the epitaxial layer after the completion of the change with the passage of time.

Now, the procedure followed in the derivation of the formula (4) mentioned above will be explained below. The following formula (5) is obtained by dividing the component expressions of the aforementioned formulas (2) and (3).

$$(\rho + \Delta\rho)/\rho = t/(t-\Delta t) \qquad (5)$$

The formula (6) is obtained by solving this formula with respect to the term $\Delta t$.

$$\Delta t = [\Delta\rho/(\Delta\rho + \rho)]t \qquad (6)$$

Since the term $\Delta\rho$ represents the increment of the resistivity due to the change with the passage of time, namely $\rho NH_4OH - \rho$, the following formula (7) is derived from the formula (6).

$$\Delta t = [(\rho NH_4OH - \rho)/\rho NH_4OH]t \qquad (7)$$

The formula (4) is derived by solving this formula with respect to the term $\rho$.

Further, the following formula (8) is derived by solving the formula (4) with respect to the term $\rho$.

$$\rho = [(t-\Delta t)/t] \rho NH_4OH \qquad (8)$$

Here, the following formula (9) is derived by letting $\alpha$ (coefficient for conversion) stand for the term $(t-\Delta t)/t$.

$$\rho = \alpha \cdot \rho NH_4OH \qquad (9)$$

Therefore, by preparatorily finding the relation between $\rho NH_4OH$ and $\Delta t$ based on the results of actual measurement, the true resistivity $\rho$ of an another sample can be found by finding the increment $\Delta t$ based on the term $\rho NH_4OH$ obtained by actual measurement, then finding the t obtained by actual measurement, and calculating the product of this coefficient $\alpha$ multiplied by the actually measured value of $\rho NH_4OH$ in accordance with the formula (8).

Now, the results of the working examples cited above will be explained below.

EXAMPLE 1

The results of Test Run 1 indicate the trend that the resistivity and the change thereof with the passage of time both increase in proportion as the relative humidity of the atmosphere in which the sample is stored (not shown).

Figure 1:
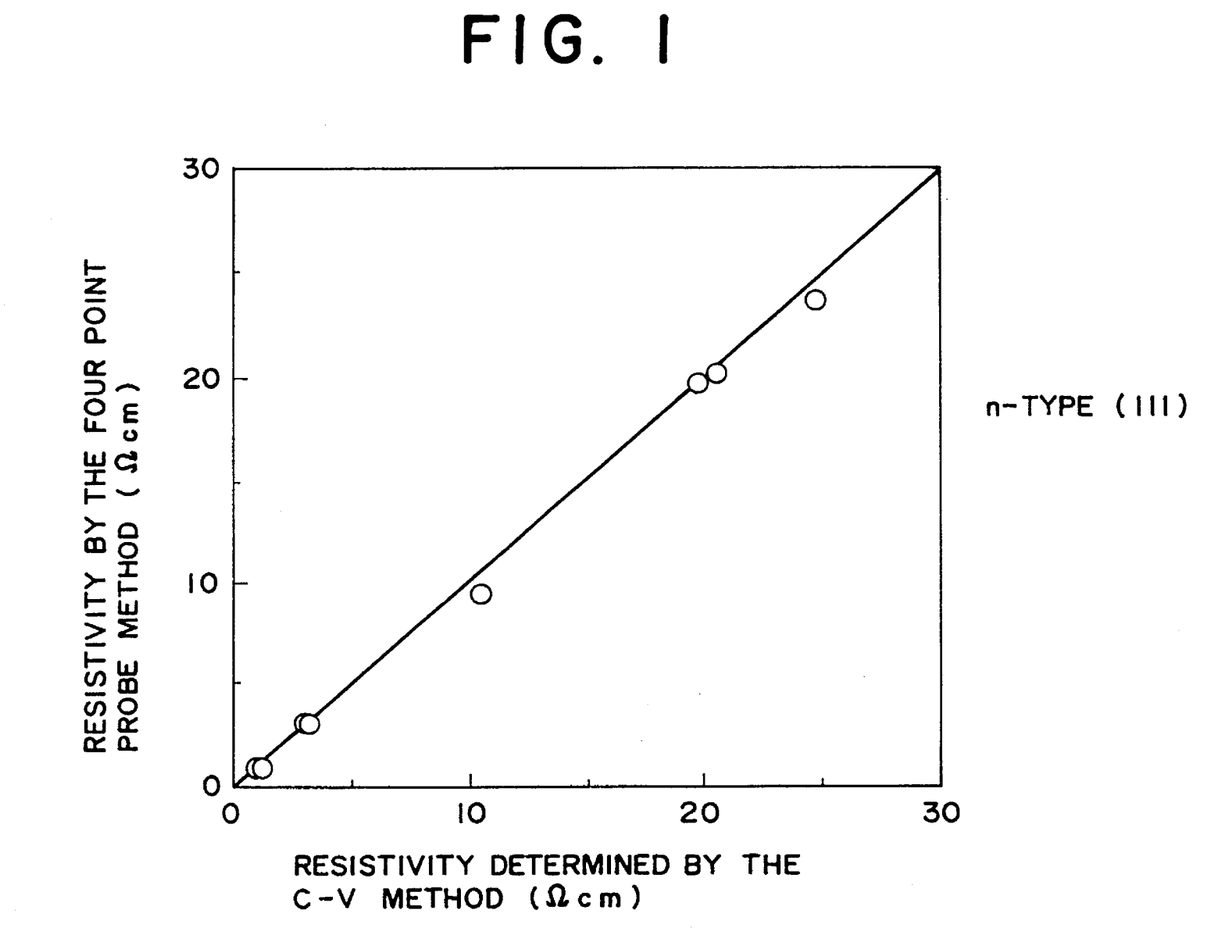
FIG. 1 is a graph showing the results of Example 1.
Figure 2:
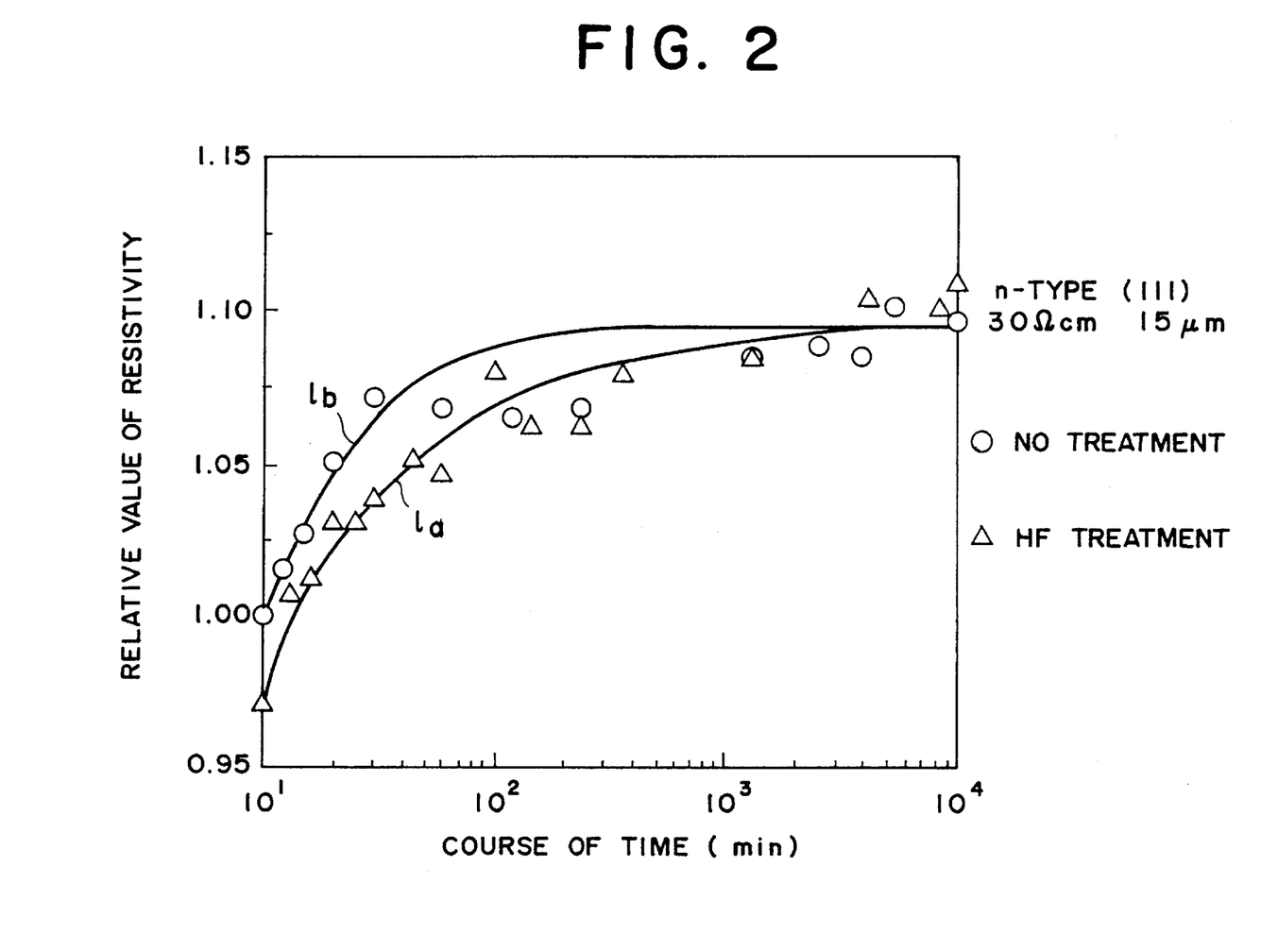
FIG. 2 is a graph showing the results of the conventional method and Example 1.

The results of Test Run 2 deny the presence of a discernible change of resistivity with the passage of time in an atmosphere having a relative humidity of 50% and indicate that they coincide substantially those determined by the C-V method as shown in FIG. 1. In consideration of the fact that this C-V method unveils no discernible change of the resistivity of an n-type epitaxial layer with the passage of time, it is safely concluded that the method of Test Run 2 is capable of determining the true resistivity of the epitaxial layer. The change of resistivity with the passage of time in an atmosphere of a relatively high humidity such as, for example, 60% is as represented by the curve 1a in FIG. 2. It approximates the change of the curve 1b which occurs when the sample after the epitaxial growth is left standing in its unaltered form in an atmosphere of normal levels of temperature and humidity.

Figure 3:
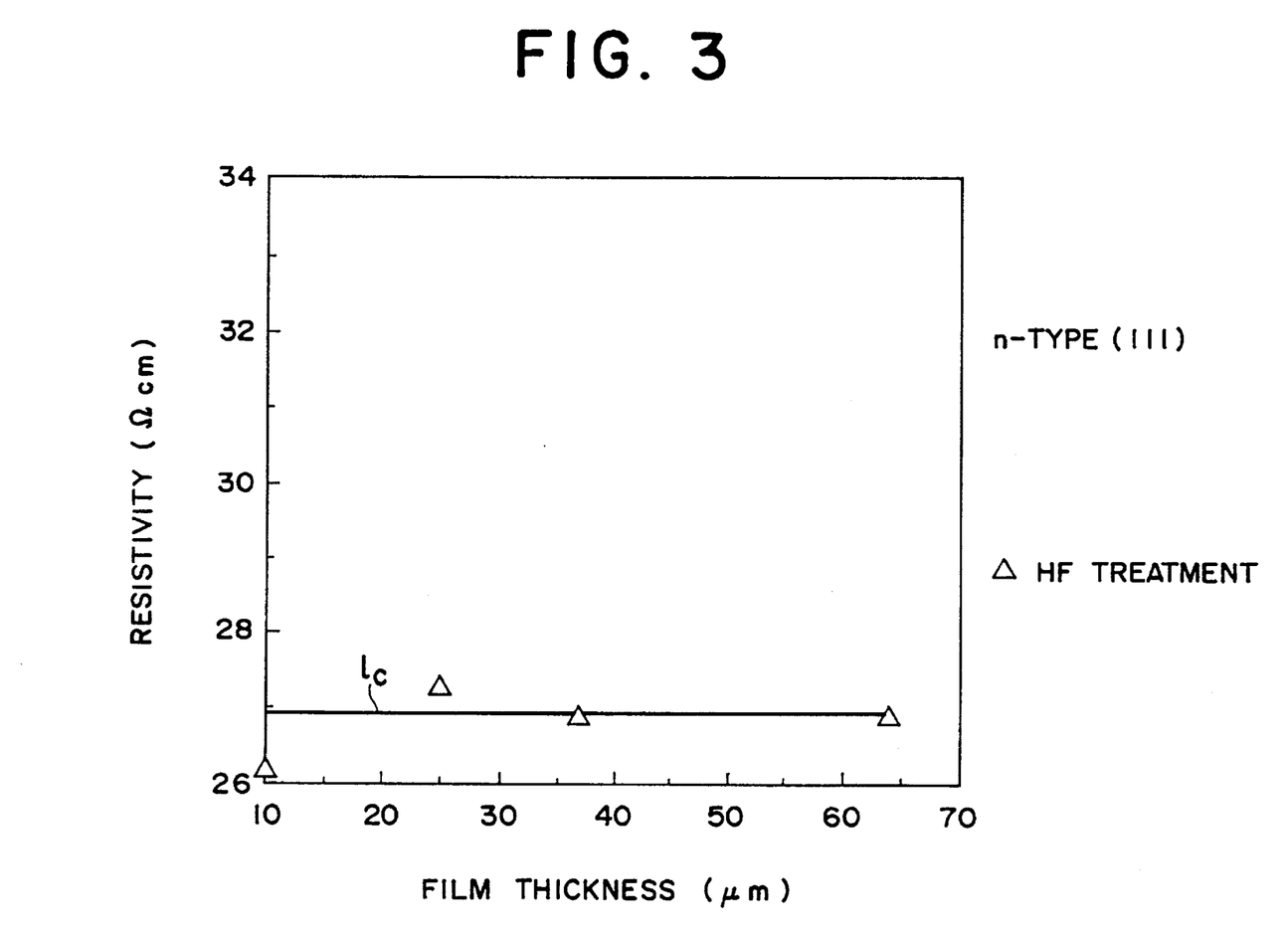
FIG. 3 is a graph showing theresuits of Example 1.

When the same silicon wafer as used in the conventional method was tested by following the procedure of Test Run 2, the resistivity exhibited by the sample after it had been left standing in an atmosphere having a relative humidity of not more than 50% was substantially constant without reference to the film thickness of the epitaxial layer as indicated by the curve 1c in FIG. 3.

EXAMPLE 2

The resistivity in an atmosphere having a relative humidity of 50% showed no discernible change with the passage of time and equalled the resistivity after the growth of the epitaxial layer and coincided substantially with the magnitude determined by the C-V method. In atmospheres having the degrees 60% and 95% of relative humidity, the resistivity showed changes with the passage of time, though more slowly than the change found in Example 1.

EXAMPLE 3

Figure 4:
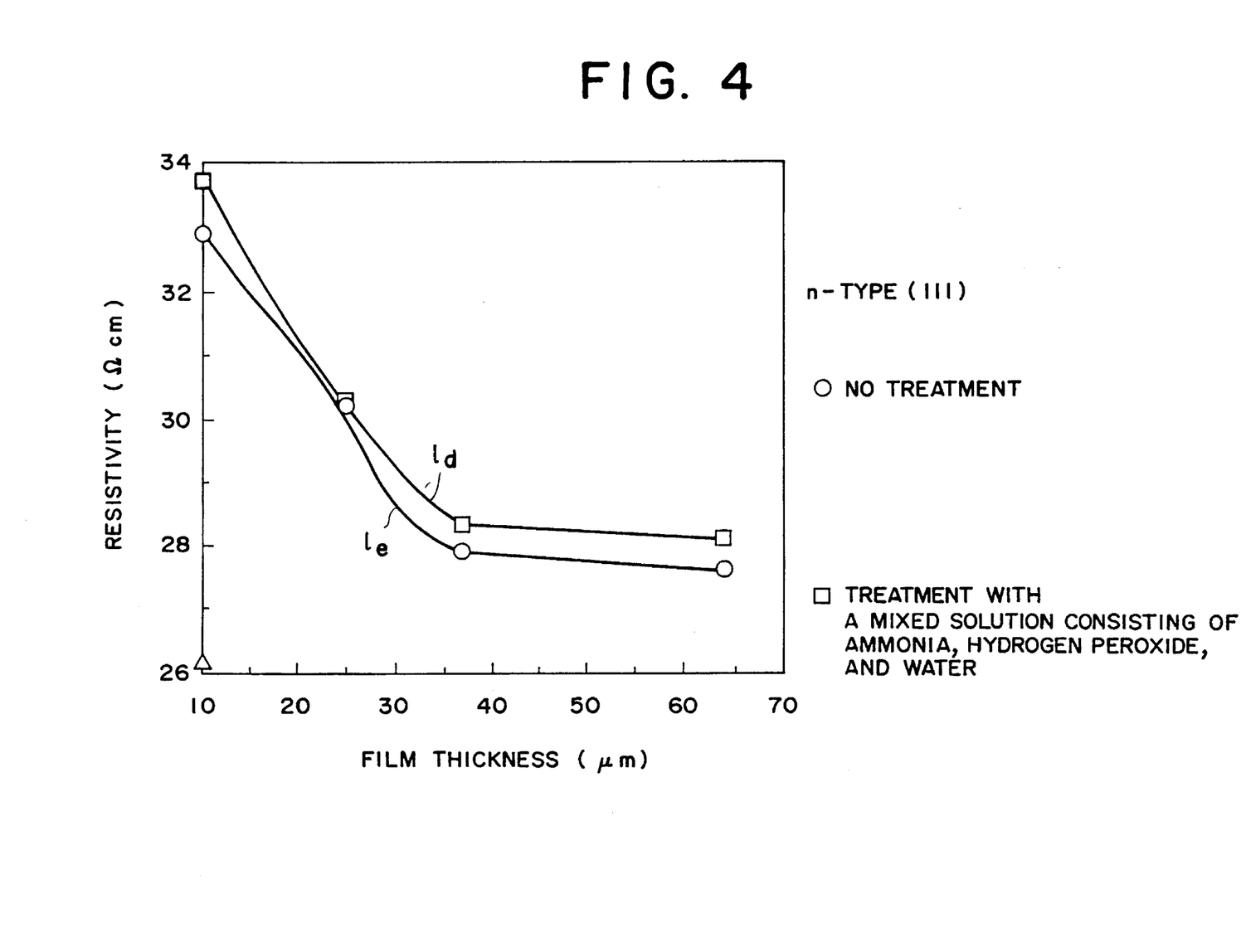
FIG. 4 is a graph showing theresuits of the conventional method and Example 3.

The resistivity exhibited by the sample which had been treated with a mixed solution consisting of ammonia, hydrogen peroxide, and water showed such a change as indicated by the curve $1d$ in FIG. 4. The resistivity which the sample produced by the conventional method exhibited after the convergence of the change with the passage of time showed such a change as indicated by the curve $1e$ in the same diagram. It is clearly noted from the diagram that the resistivity after the convergence mentioned above generally coincided with the resistivity of Example 3, a fact which indicates that the treatment with a mixed solution consisting of ammonia, hydrogen peroxide, and water brings about the state of completion of the change of the resistivity (sheet resistance) of the n-type epitaxial layer with the passage of time.

Figure 5:
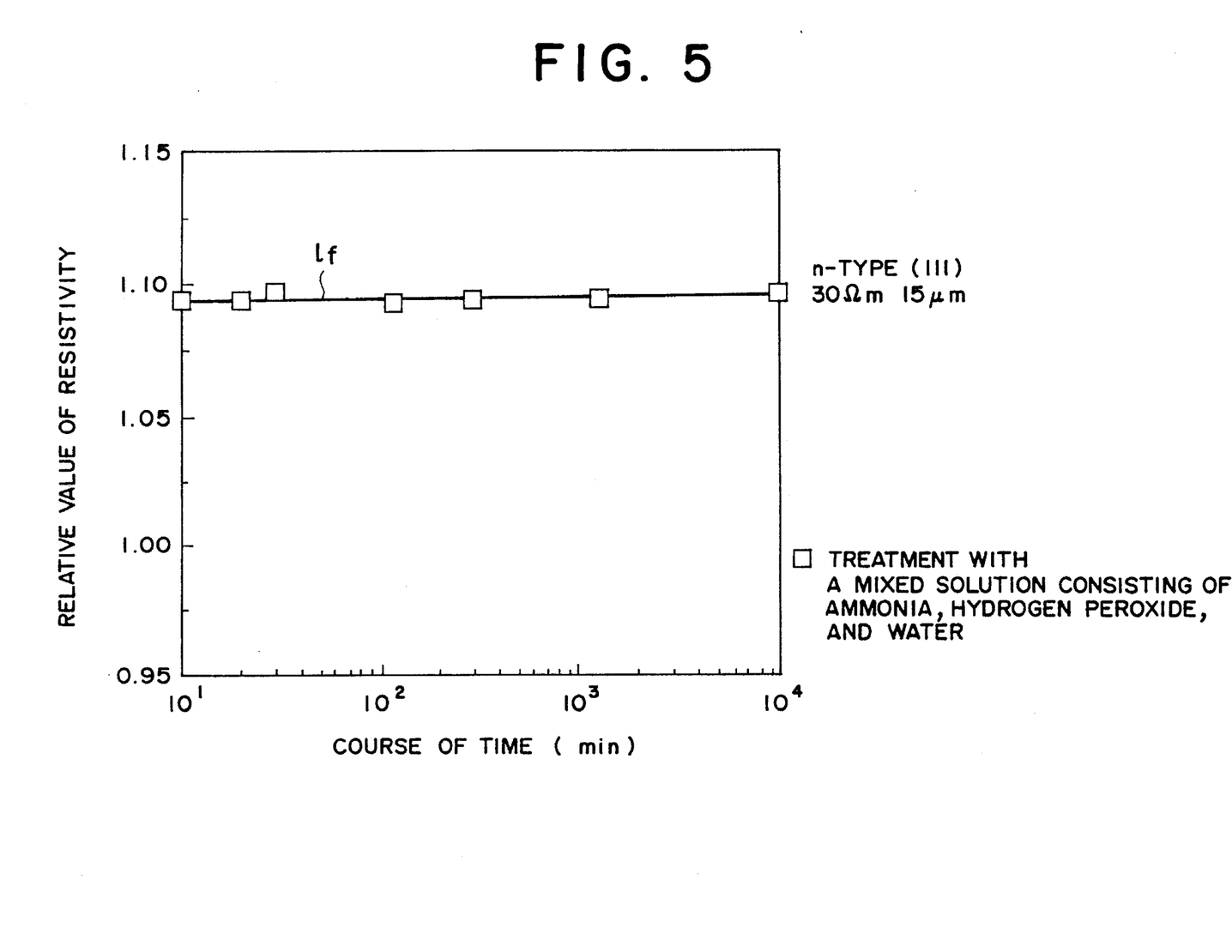
FIG. 5 is a graph showing the results of Example 3.

As represented by the curve $1f$ in FIG. 5, the sample which was treated with a mixed solution consisting of ammonia, hydrogen peroxide, and water in accordance with the procedure of Example 3 showed no discernible change with the passage of time even when it was left standing in an atmosphere of normal room temperature and a relative humidity of 95%.

The sample using a mixed solution consisting of hydrochloric acid, hydrogen peroxide, and water yielded the same results as the sample using a mixed solution consisting of ammonia, hydrogen peroxide, and water. Though the sample using the aqueous hydrogen peroxide solution or purified water formed an oxide film at a lower speed than the sample using a mixed solution consisting of ammonia, hydrogen peroxide, and water, it was enabled to form a stable oxide film by elongating the time of immersion in the bath of treatment.

EXAMPLE 4

Figure 6:
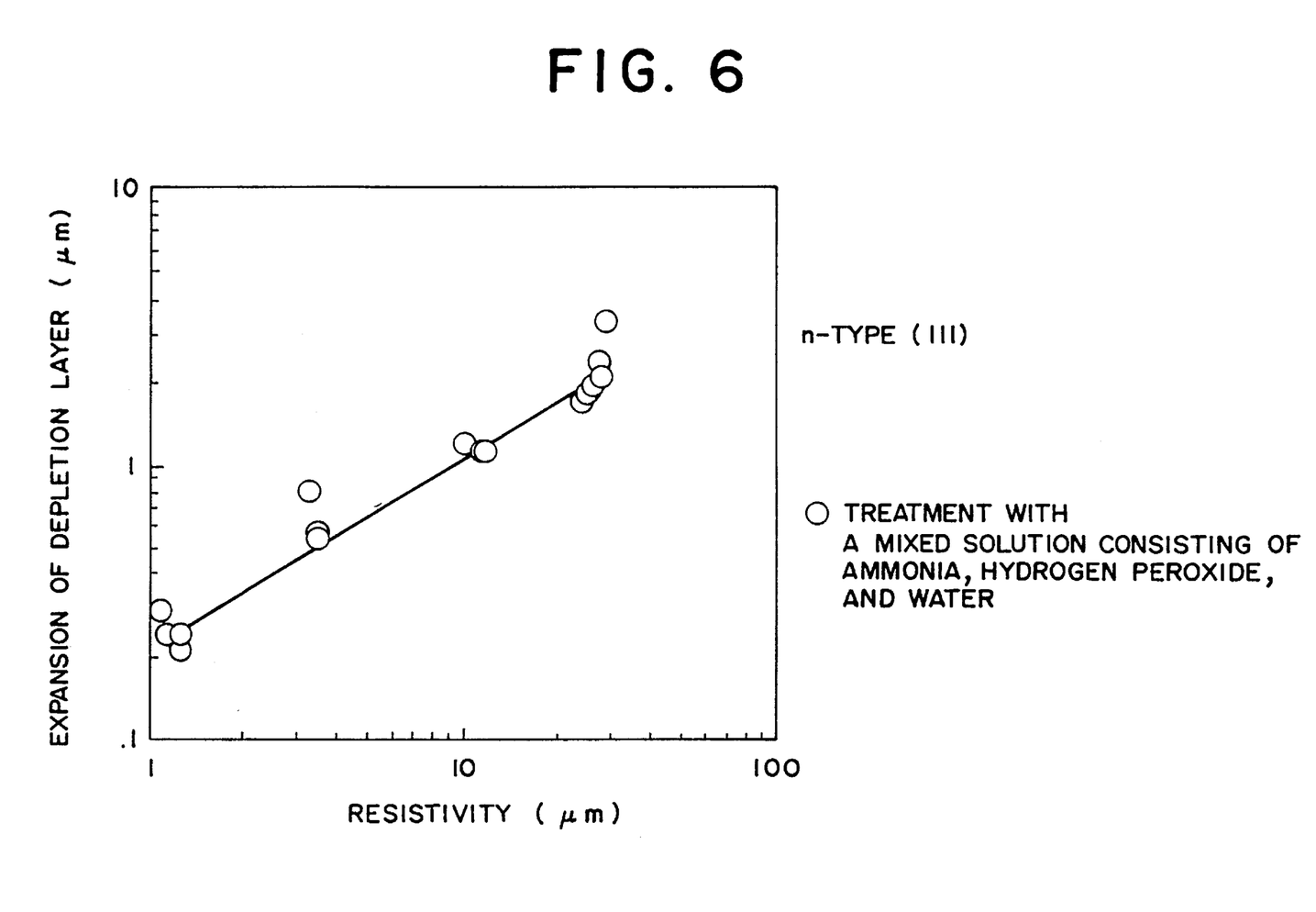
FIG. 6 is a graph showing the results of Example 4.

As shown in the graph of FIG. 6 which plots the resistivity $\rho NH_4OH$ after the completion of the change with the passage of time along the horizontal axis and the expansion $\Delta t$ of the depletion layer along the vertical axis, the data of various samples are found to fall substantially on one straight line.

In the case of a sample whose true resistivity $\rho$ is unknown, therefore, this resistivity $\rho$ can be found by actually measuring the magnitudes of t and $\rho NH_4OH$, finding the increment $\Delta t$ based on the magnitude of $\rho NH_4OH$ in accordance with FIG. 6, then calculating the aforementioned coefficient a from the magnitudes of t and $\Delta t$, and calculating the product of the magnitude of $\rho NH_4OH$ multiplied by the coefficient $\alpha$ [refer to the formula (9)].

Figure 7:
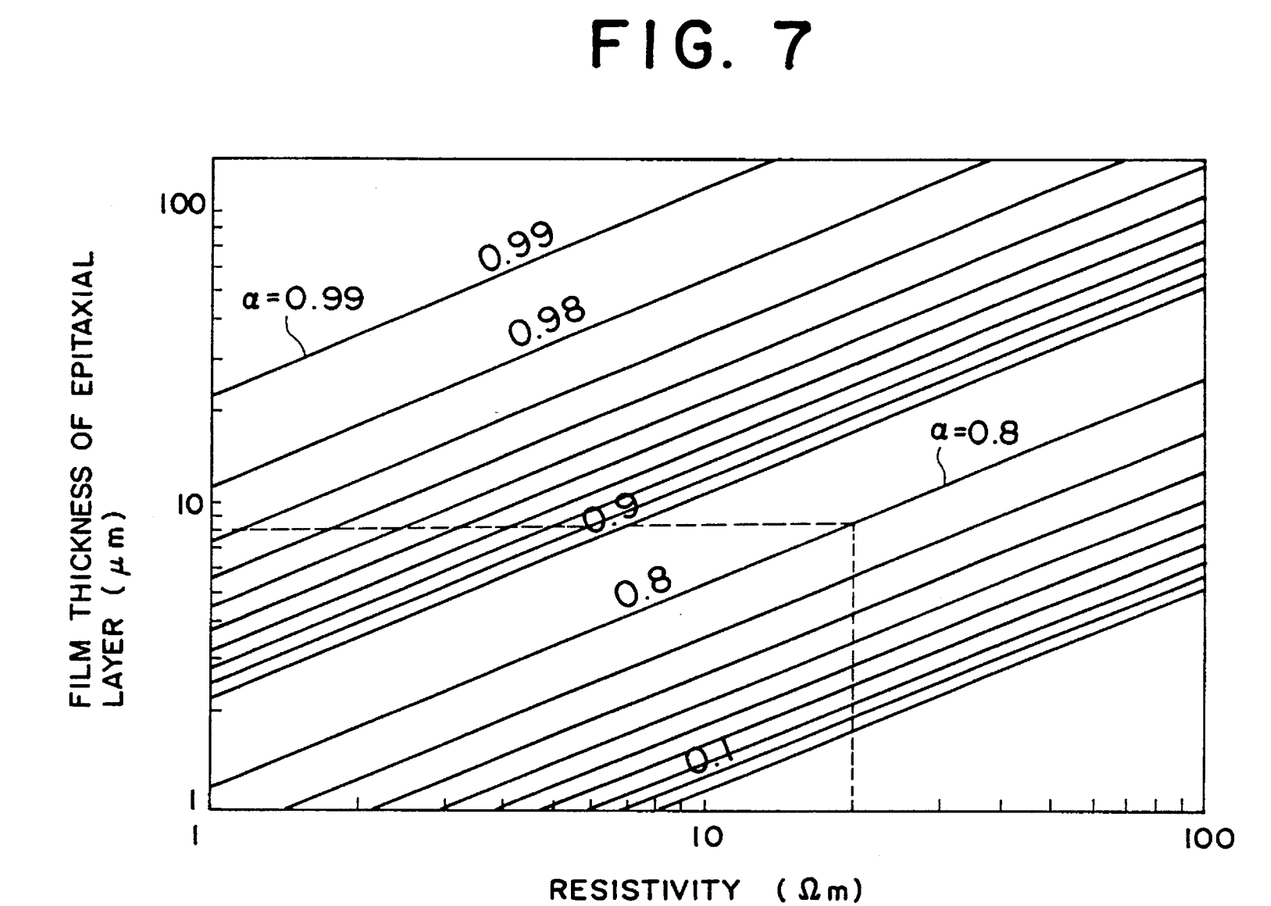
FIG. 7 is a diagram for the determination of the true resistivity based on the resistivity after completion of a change with the passage of time and the film thickness of an epitaxial layer.

FIG. 7 depicts an improved version of the method of calculation of the coefficient $\alpha$ in accordance with the graph of FIG. 6. This diagram represents a graph which was obtained by preparatorily obtaining data similar to those of FIG. 6 with respect to various samples having varying magnitudes of $\rho NH_4OH$ and t and then plotting the magnitudes of the coefficient $\alpha$ fixed by the magnitudes of $\rho NH_4OH$ and t.

On the graph of FIG. 7, the coefficient $\alpha$ can be determined by picking the point representing the magnitude of $\rho NH_4OH$ on the horizontal axis, drawing a perpendicular line including this point to the horizontal axis, similarly picking the point representing the magnitude of t on the vertical axis, drawing a perpendicular line including this point to the vertical axis, and reading the point of intersection of the two perpendicular lines. If this point of intersection is found to fall on the line 0.8 in the plurality of lines (lines indicating the coefficients of conversion), for example, this particular numeral 0.8 is obtained as the coefficient being sought.

Figure 8:
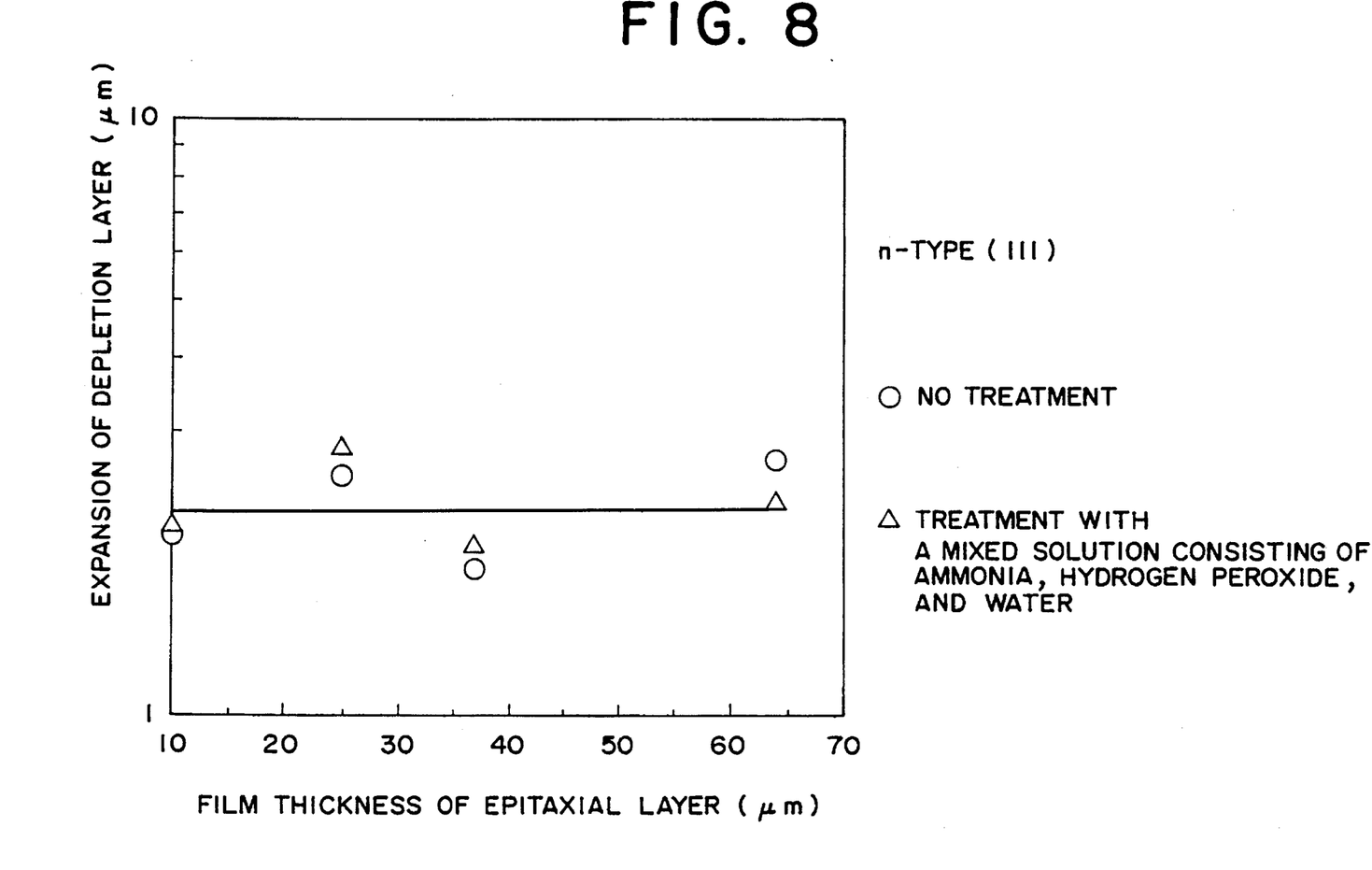
FIG. 8 is a graph showing the results of the conventional method and Example 4.

It is clearly noted from the results of Example 4 and those of the conventional method which are shown in FIG. 6 and FIG. 8 that the magnitude of the expansion $\Delta t$ of the depletion layer in the silicon wafer having converged resistivity did not depend on the film thickness t of the epitaxial layer but depended solely on the resistivity.

The description given thus far clearly indicates that the method for determination of the resistivity according to the first aspect of this invention allows the true resistivity of an n-type epitaxial layer to be accurately and infallibly determined by treating the surface of the n-type epitaxial layer for hydrogen termination and then measuring the sheet resistance of the n-type epitaxial layer by the four point probe method, with the surface kept fast in the state of hydrogen termination. This determination of the resistivity brings about the effect of facilitating guaranty of the quality of a silicon wafer and contributing to exaction of the management of the production process.

The methods for determination of the resistivity according to the second and third aspect of this invention allow the surface of a given n-type epitaxial layer of a sample to be treated for hydrogen termination easily and conveniently, enable the state of hydrogen termination to last stably, and permit the true resistivity of the sample to be determined accurately and infallibly. In the case of the method according to the third aspect of this invention, even when the sample is not stored in an atmosphere having prescribed degrees of temperature and humidity, the accurate determination of the true resistivity is attained because this determination is carried out before the formation of a natural oxide film takes place.

The method for determination of the resistivity according to the fifth aspect of this invention enables the true resistivity to be found easily and conveniently by calculating the product of the newly determined magnitude of resistivity after the completion of the change with the passage of time multiplied by the predetermined ratio of change of the resistivity.

The method for determination of the resistivity according to the sixth aspect of this invention permits a stable oxide film to be formed easily and conveniently on the surface of an n-type epitaxial layer by using a mixed solution consisting of ammonia, hydrogen peroxide, and water, for example, for the treatment of the surface for hydrogen termination and, at the same time, prevents the resistivity from being changed with the passage of time owing to the presence of this oxide film. Thus, this method is effective in ensuring effective use of the method for determination according to the fifth aspect of this invention.

While there have been shown and described present preferred embodiments of the invention, it is to be distinctly understood that the invention is not limited thereto but may be otherwise variously embodied and practiced within the scope of the following claims.

What is claimed is:

1. A method for determination of resistivity of an n-type epitaxial layer formed on a silicon substrate characterized by;

subjecting the surface of said n-type epitaxial layer to hydrogen termination; keeping said n-type epitaxial layer in a hydrogen terminal state; and four point probe method measuring sheet resistance of said surface; and wherein determination of said resistivity of said n-type silicon epitaxial layer is accomplished by the steps of;

growing said n-type epitaxial layer on a silicon substrate;

displacing an inner gas of an epitaxial growth reactor with hydrogen gas and cooling said silicon substrate to a temperature below 400° C. thereby effecting said hydrogen termination of the surface of said n-type epitaxial layer;

subsequently displacing said hydrogen gas in said epitaxial growth reactor with an inert gas;

simultaneously cooling said silicon substrate to normal room temperature;

removing said cooled silicon substrate from said epitaxial growth reactor; and four point probe method measuring sheet resistance of said n-type epitaxial layer.

2. A method according to claim 1, wherein said silicon substrate is caused to contact with a dilute aqueous hydrofluoric acid solution to remove a natural oxide film formed on the surface of said n-type epitaxial layer and, at the same time, effect said hydrogen termination, rinsed with deionized water, dried, and subjected to measurement of said sheet resistance by the four point probe method.

3. A method according to claim 1, further comprising the step of multiplying sheet resistance measured by the four probe method by film thickness of said n-type epitaxial layer determined by a FTIR method or a spreading resistance (SR) method and a constant ($\pi/\ln 2$).

4. A method for determination of resistivity of an n-type epitaxial layer formed on a silicon substrate characterized by the steps of:

finding changes of resistivity with passage of time with respect to n-type epitaxial layers possessing varying magnitudes of resistivity, treating the surface of an n-type epitaxial layer on a silicon substrate subjected to determination of resistivity with a chemical solution thereby forming a stable oxide film on said surface, rinsing the treated surface of said n-type epitaxial layer, drying the wet n-type epitaxial layer, four point probe method measuring sheet resistance thereby obtaining resistivity after a change with passage of time;

and obtaining true resistivity based on magnitude of resistance in combination with a ratio of change in resistivity with passage of time.

5. A method according to claim 4, wherein said chemical solution is a mixed solution consisting of ammonia, hydrogen peroxide, and water, a mixed solution consisting of hydrochloric acid, hydrogen peroxide, and water, an aqueous hydrogen peroxide solution, or deionized water.

6. A method according to claim 4, further comprising the step of multiplying sheet resistance measured by said four point probe method by film thickness of said n-type epitaxial layer determined by the FTIR method or the SR method and a constant ($\pi/\ln 2$).

7. A method according to claim 4, wherein said ratio of change in resistivity with the passage of time is:

$$\frac{\rho + \Delta \rho}{\rho} = \frac{t}{t - \Delta t}$$

* * * * *